United States Patent [19]

Holman

[11] 4,071,323

[45] Jan. 31, 1978

[54] DIFFUSION CRUCIBLE AND SLAB MEMBER WITH COMMON METAL COMPONENT IN THE VAPOR PHASE

[75] Inventor: Robert L. Holman, Pittsford, N.Y.

[73] Assignee: Xerox Corporation, Stamford, Conn.

[21] Appl. No.: 730,918

[22] Filed: Oct. 8, 1976

[51] Int. Cl.² .............................................. B01D 9/00
[52] U.S. Cl. ................................. 23/273 R; 156/613;
156/612; 427/86; 427/162; 423/593; 156/DIG. 83; 350/96 WG
[58] Field of Search ............... 156/DIG. 83, DIG. 63, 156/DIG. 73, 606, 603, 610, 613, 624, 612; 23/273 R, 273 SP, 292, 294; 432/265; 427/82, 85, 86, 87

[56] References Cited
U.S. PATENT DOCUMENTS 3,796,552  3/1974  Robinson et al. ............ 156/DIG. 83

OTHER PUBLICATIONS

Holman, "Novel Uses of the Thermo-Microbalance in the Determination of Non Stoichiometry in Complex Oxide Systems", J. Vac. Sci. Tech., vol. 11, No. 1, Jan., Feb. 1974 (pp. 434–439).

Holman et al., "Intrinsic Non Stoichiometry in the Lead Zirconate-Lead Titanate System Determined by Knudsen Effusion", J. Appl. Phys., vol. 44, No. 12, Dec. 1973 (pp. 5227–5236).

Primary Examiner—Norman Yudkoff
Attorney, Agent, or Firm—James J. Ralabate; James P. O'Sullivan; George J. Cannon

[57] ABSTRACT

A slotted crucible for altering the nonstoichiometry of a crystalline member by promoting conditions of vapor phase equilibrium between the member and the slotted crucible in which it is placed. The slotted crucible comprises material sharing a common vapor species with the crystalline member and provides an atmosphere of substantially constant thermodynamic activity with respect to the shared vapor phase upon isothermal heating of the member and crucible.

8 Claims, 5 Drawing Figures

SLOTTED CRUCIBLE FABRICATION

DIFFUSION CRUCIBLE AND SLAB MEMBER WITH COMMON METAL COMPONENT IN THE VAPOR PHASE

BACKGROUND OF THE INVENTION

This invention relates to vapor phase equilibration and more particularly, to a novel crucible design for vapor phase equilibration between two solids.

In recent years, interest in forming active optical waveguiding structures has been stimulated by the need for optical modulators and deflectors, as well as for more efficient harmonic generators. To date, for device applications, experimental emphasis has been placed on those waveguides formed within, or on, single crystalline materials such as lithium niobates: J. M. Hammer and W. Phillips, Appl. Phys. Lett., 24, 545 (1974) I. P. Kaminow and J. R. Carruthers, Appl. Phys., Lett., 22,326 (1973); J. R. Carruthers, I. P. Kaminow and L. W. Stulz, Appl. Opt., 13, 2333 (1974); I. P. Kaminow, J. R. Carruthers, E. H. Turner, and L. W. Stultz, Appl. Phys. Lett., 22, 540 (1973); U.S. Pat. Nos. 3,837,827 and 3,911,176. Single crystalline materials such as the garnets have also been emphasized: P. K. Tien, R. J. Martin, S. L. Blank, S. H. Wemple, and L. J. Varnerin, Appl. Phys. Lett., 21, 207 (1972); P. K. Tien, R. J. Martin, R. Wolfe, R. C. LeCraw and S. L. Blank, Appl. Phys. Lett., 21, 397 (1972); and P. K. Tient and D. P. Schinke, J. Appl. Phys., 45, 2059 (1974).

Promising results have been obtained by forming a thin layer within a substrate such as, for example, by diffusion, ion exchange, or ion implantation. See, for example, the extensive reference list contained in P. K. Tien and A. A. Ballman, J. Vac. Technol., 12, 892 (1975). Vacuum out diffusion such as reported in the lithium niobate articles cited above produces a nonstoichiometric waveguide layer characterized by a large defect concentration of lattice vacancies and the formation of lithium deficient phases at, or near, the surface. Metal ion, in-diffused waveguides such as reported in the above cited articles on garnets and in R. V. Schmidt and I. P. Kaminow, Appl. Phys. Lett., 25, 458 (1974) and in J. Noda, T. Saku and N. Uchida, Appl. Phys. Lett., 25, 308 (1974) developed equivalent defect concentrations of lattice vacancies and usually leave a residual layer of nondiffused oxide on the surface.

Neither approach offers sufficient flexibility in adjusting either the magnitude of the refractive index change or the shape of the refractive index profile to provide reproducible results of the degree of stability required for stabilization and interchangeability of like components in fine tuned integrated optical circuitry.

The present invention is directed to the redesign of the constant activity multiple phase crucible developed by the inventor and reported in "Intrinsic and Extrinsic Nonstoichiometry in the Lead ZirconateTitanate System", Ph.D. Thesis, Univ. of Calif., Berkeley, 1972, (LBL880); "Intrinsic Nonstoichiometry in the Lead ZirconateLead Titanate System Determined by Knudsen Effusion", J. Appl. Phys., 44, 5227 (1973); and "Novel Uses of the ThermoMicrobalance in the Determination of Nonstoichiometry in Complex Oxide Systems", [J. Vac. Sci. Technol., 11, 434 (1974) to solve the reproducibility problem in optical waveguides and to control the magnitude and profile of the optical index of refraction therein; and, to achieve mass transport under vapor phase equilibrium conditions between solids having a common vapor phase whose vapor pressure is less than about $10^{-4}$ atm.

SUMMARY OF THE INVENTION

An object of this invention is to overcome the above-noted deficiencies by providing a constant activity, multiple phase crucible having a slot or cavity of novel design for vapor phase equilibration between a crystalline member and the crucible.

These and other objects are provided by a porous, multiphase solid comprising material having a vapor phase in common with the crystalline member at some temperature and provided with a cavity in which said crystalline member can be placed, the cavity having dimensions 1 to 3 millimeters greater than the crystalline member.

DETAILED DESCRIPTION OF THE PREFERRED EMBODIMENTS

General Applicability to Nonstoichiometric Materials

Complete and partial vapor phase equilibration can be applied to any A-B system of two or more components that contains at least one intermediate nonstoichiometric phase $AB_m$ such that vaporization of $AB_m$ occurs incongruently, and therefore preferentially, with only a single subcomponent, A, exhibiting a significant partial pressure at temperatures below the liquidus of the system. Consequently, subcomponent A can be any volatile metal oxide, or metal sulfide, etc., whereas subcomponent B must be either one or more relatively nonvolatile compatible constituents. The Intermediate solid $AB_m$ may be either a single or polycrystalline material in the form of a slab or a thin film. A partial listing of applicable materials is summarized in Table I.

TABLE I

| | CLASS | VOLATILE COMPONENT | TYPICAL COMPOUNDS | FE | EO | AO | SX | PX | OD | ID |
|---|---|---|---|---|---|---|---|---|---|---|
| 1. | COMPLEX LEAD OXIDES | PbO | (Pb,Ba) (Br,Ti)$O_3$ "PLZT" | X | X | | | X | | X |
| | | | PbW$O_4$ etc. | | | X | X | X | | |
| | | | PbN$b_2O_6$ etc. | X | X | | X | X | | X |
| | | | PbT$a_2O_6$ etc. | X | X | | X | X | | X |
| | | | P$b_2$S$i_2O_7$ etc. | ? | ? | | X | X | | X |
| 2. | COMPLEX BISMUTH OXIDES | B$i_2O_3$ | B$i_4$T$i_3O_{12}$ etc. | X | X | | X | X | | X |

TABLE I-continued

| CLASS | VOLATILE COMPONENT | TYPICAL COMPOUNDS | FE | EO | AO | SX | PX | OD | ID |
|---|---|---|---|---|---|---|---|---|---|
| 3. COMPLEX MOLYBDENUM OXIDES | $MoO_3$ | $RMoO_4$ etc. R=(Gd,Ba,Cd,Ca*, Mg*,Sr) $MoAl_2O_4$ etc. | | | X | X | X | X | * |
| 4. COMPLEX TIN OXIDES | $SnO_4$ | $RSnO_3$ etc. R=(Ba,Cd*,Ca,Mg,Sr) $SnCo_2O_4$ etc. | | ? ? ? | | ? | X X X | * | X X X |
| 5. COMPLEX GERMANIUM OXIDES | $GeO_4$ | $R_4Ge_3O_{12}$ etc. R=(Ba,Cd*,Ca,Mg,Sr) | X | X | | X | X | * | X |
| 6. COMPLEX LITHIUM OXIDES | $Li_2O$ | $LiMO_3$ etc. M=(Nb,Ta,V) | X | X | | X | X | X | |
| 7. COMPLEX SODIUM, POTASSIUM, and/or RUBIDIUM OXIDES | $Na_2O$ $K_2O$ $Rb_2O$ | $R_1(R_2)O_3$ etc. $R_1$=(Na,K,Rb) $R_2$=(Nb,Ta,V) | X | X | | ? | X | X | |
| 8. COMPLEX CADMIUM SULFIDES, SELENIDES, and/or TELURIDES | CdS CdSe CdTe | $Cd_xMn_{1-x}S$ etc. | | | | X | X | | X |
| 9. COMPLEX BORON OXIDES | $BO_2$ | $FeBO_3$ | | | | X | X | X | |

FE=FERROELECTRIC
EO=ELECTROOPTIC
AO=ACOUSTOOPTIC
SX=SINGLE CRYSTALLINE
PX=POLYCRYSTALLINE
OD="OUT-DIFFUSED"
ID="IN-DIFFUSED"
NOTE: Compounds with more than a single vapor species (i.e., $PbMoO_4$) are not precluded if vaporization is incongruent.

Process Environment

Figure 5:
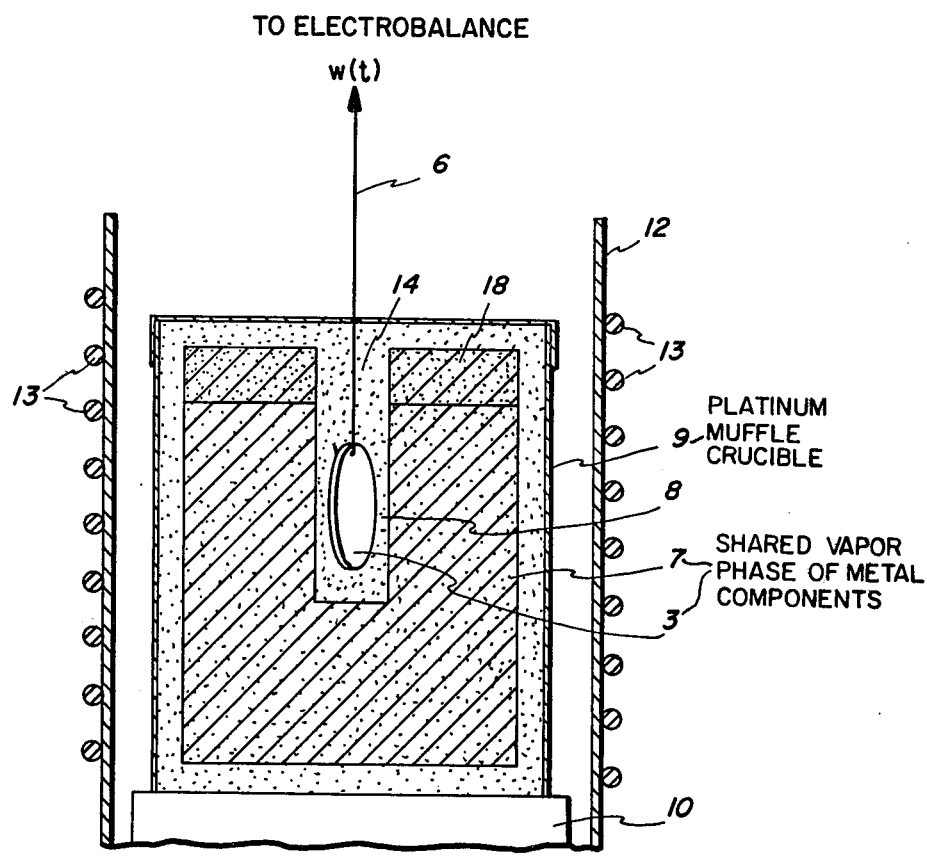
FIG. 5 is a schematic illustration of the environment of the process in which the crucible of the present invention is employed.

FIG. 5 schematically illustrates a suitable process environment. Transparent crystalline member 3 is suspended within crucible 7 comprising material having a vapor phase in common with crystalline member 3. Dots 8 represent the shared vapor phase $A_2O_m$ which, owing to the large mass of crucible 7 relative to member 3, is constant in activity (i.e., partial pressure, chemical potential and other thermodynamic parameters of the atmosphere are constant with respect to the shared vapor phase). For precise definitions of these commonly used thermodynamic quantities, see, for example, *Solid State Thermodynamics,* R. A. Swalin, John Wily and Son, New York 1962. Crucible 7 sits within muffel-crucible 9, typically of platinum, which in turn rests upon pedestal 10. The muffel crucible 9 and pedestal 10 are placed within furnace 12 and isothermally heated by heating elements 13. The crucible 7 is open to the atmosphere via opening 14 and therefore the $A_2O_m$ vapor phase 8 must diffuse through air.

The identity of the gas through which the $A_2O_m$ vapor phase must diffuse (air in FIG. 8) does affect the kinetics of solid state diffusion within the crystalline member. Atmospheric air as the gas is preferred for the numerous complex oxides with which the invention can be practiced to assure the presence of any necessary equilibrium oxygen partial pressure in the controlled atmosphere surrounding the crystalline member. However, gases other than air can be employed when the vapor phase activity gradient is too small to overcome the resistance of the gas diffusion of the $A_2O_m$ vapor phase between the crystalline member and crucible (in either in or out diffusion). As used herein, activity gradient means the difference in activity with respect to the shared vapor phase between the crucible and the crystalline member divided by the distance separating the crystalline member and the crucible. Generally speaking, the rate of transport of the $A_2O_m$ vapor phase between the crucible and crystalline member depends upon mobility, activity gradient and degree of thermal convection. The mobility depends upon temperature and the identity of the gas, the pressure of the gas and the size of the gas molecules. Given a constant vapor phase mobility, a constant temperature and a constant pressure the rate of $A_2O_m$ transport is determined by the activity gradient of the $A_2O_m$ vapor phase. Alternately, with a constant activity gradient, a constant temperature and pressure, the mobility of the $A_2O_m$ vapor phase can be increased by substituting gases; or, without substituting gases, the amount of gas employed can be reduced to provide a reduced pressure of the background gas (i.e. air) at the isothermal heating step thereby allowing an increased mobility of the $A_2O_m$ vapor phase. However, for typically small crystalline member - crucible separation distances, thermal convection will most likely provide the dominate influence.

Preparation of Slotted Constant Activity Multi-Phase (CAMP) Crucibles

The vapor phase equilibration of two condensed phases, as previously discussed, requires that one substance behave as a constant source of, or sink for, their common vapor species. This is possible if the effective diffusion rate of the volatile subcomponent within one substance is sufficient to maintain equilibrium with the vapor at its vapor exposed surface such that its chemical potential or activity remains constant. In addition, the transport of the vapor species between the two substances must be sufficiently rapid so as not to influence the equilibration kinetics.

Figure 1:
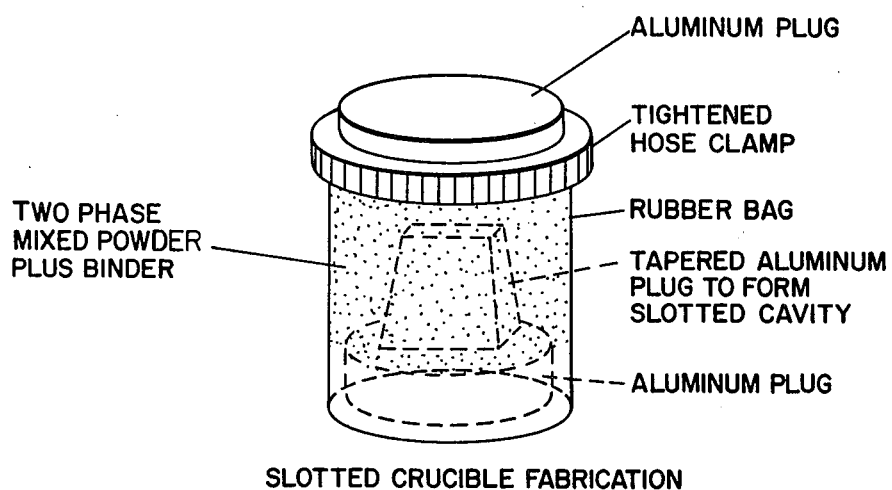
FIG. 1 is a schematic illustration of a technique for fabricating the slotted crucible of the present invention.

These requirements are particularly satisfied by a porous crucible, as in FIG. 1, composed of two or more homogeneously mixed equilibrium phases, and uniquely formed so as to define a cavity or "slot" such that the spacing between its walls and the inserted materials to be equilibrated is sufficiently small to produce mass transport under equilibrium conditions. One to 3 millimeters is satisfactory for materials listed in Table I. This spacing tolerance is required in order to obtain mass transport, when the common vapor phase is one having a pressure less than about $10^{-4}$ atmosphere. For example, the crucible cavity described in my aforementioned Ph.D. thesis will not provide mass transport under vapor phase equilibrium conditions when the common vapor phase is one having a pressure less than about $10^{-4}$ atmosphere.

Figure 2:
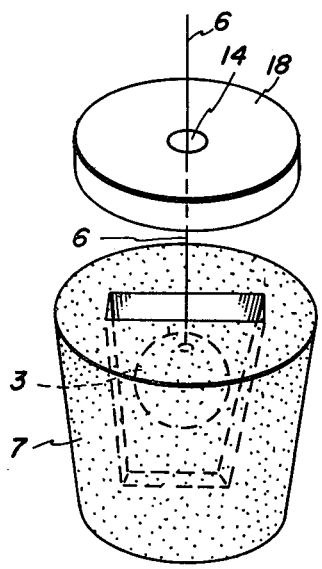
FIG. 2 is a schematic illustration of a fabricated crucible illustrating the placement of a crystalline member in the slot or cavity of the crucible.
Figure 3:
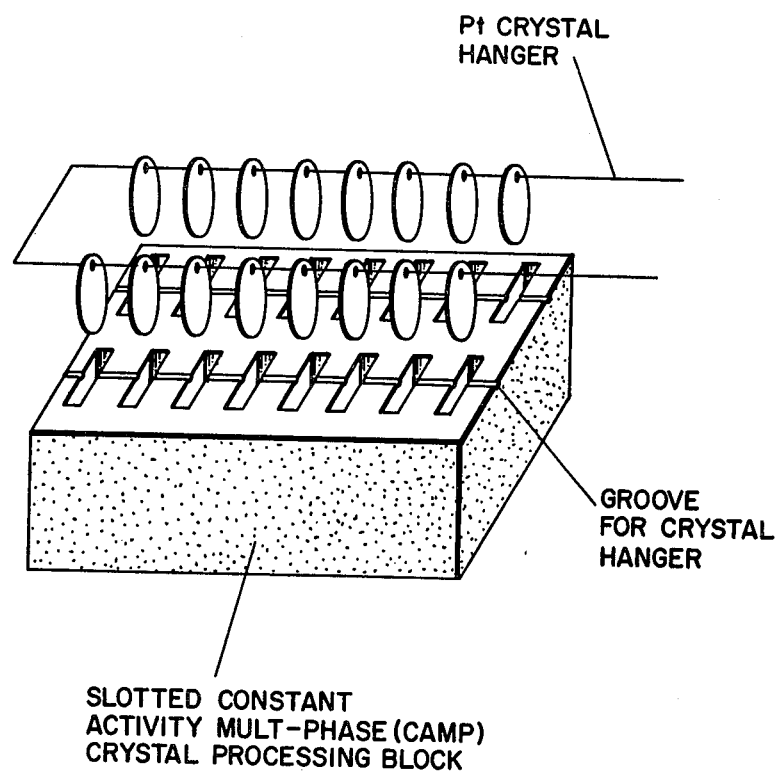
FIG. 3 is a schematic illustration of a fabricated crucible provided with a plurality of slots or cavities to accomodate a plurality of crystalline members.

CAMP crucibles were fabricated according to FIGS. 2 and 3 by mixing homogeneously proportions of reagent grade oxides or carbonates indicated in Tables II, (a) and (b). About 20 vol. % finely crushed napthalene crystals were added as a binder and porosity control. Approximately 100 grams of the lithium niobate (Table II. a.) mixture and approximately 250 grams of the PLZT mixture (Table II. b.) were separately pressed isostatically (30,000 psi) in cyclindrical rubber bags (2 inches in diameter) about a slightly tapered aluminum bar. Caps 18 were sawed from a separately pressed cylinder of the mixtures. The naphthalene was burned out, slowly (3° c/min), by heating for 12 hours at 250° C. Both the caps 18 and the crucibles 7 were calcined in air within clean covered alumina crucibles, ("LiNbO$_3$" : 12 hours at 1000° C then for 1 hour at 1100° C; "PLZT" : 24 hours, 850° C). A ⅛ inch diameter hole 14 was drilled in the center of each cap, so that the Pt hangdown wire 6 from a microbalance could be inserted into the CAMP crucible cavity through its cap to suspend a sample. The formation of multiphase crucibles was verified by X-ray diffraction.

In addition vapor phase equilibration can be applied as a process for homogenizing a single phase nonstoichiometric solid with respect to any degree of nonstoichiometry. CAMP crucibles, such as those described above will equilibrate a nonstoichiometric solid placed within, to either its most vapor-species-rich or most vapor-species-deficient composition. Alternative CAMP crucibles can be designed so as to equilibrate this nonstoichiometric solid to *any* nonstoichiometry intermediate between these two extremes. Specifically, equilibrium mixtures of compounds producing vapor species in common with the nonstoichiometric solid, but whose non-volatile components are not in common with those of the nonstoichiometric solid, can be formed such that the complex mixture's (volatile species) activity falls between the activity extrema of the nonstoichiometric solid. For example, a lithium niobate crystalline solid can be equilibrated in CAMP crucibles based upon mixtures of compounds from the Li$_2$O.Ta$_2$O$_5$ system, the Li$_2$O.Ta$_2$O$_5$.Nb$_2$O$_5$ system, or in general from the Li$_2$O.C$_2$O$_y$ system, wherein C$_2$O$_y$ is any appropriate non-volatile oxide or collections of oxides (optionally including Nb$_2$O$_5$). The action of any crucible can be characterized directly by performing complete vapor phase equilibration between the crystalline sample and the crucible and by noting the ultimate compositional changes that the crucible imparts on the crystal. In addition, a Knudsen effusion experiment can be conducted to measure the unique thermodynamic activity of the vapor species produced by the chosen CAMP crucible composition as a function of temperature.

TABLE II

SUMMARY OF SLOTTED CONSTANT ACTIVITY MULTI-PHASE (CAMP) CRUCIBLE COMPOSITIONS

II. a. LiNbO$_3$

| PHASE MIXTURE | MOLE FRACTION | |
|---|---|---|
| | Li$_2$O | Nb$_2$O$_5$ |
| LiNbO$_3$ + Li$_3$NbO$_4$ | 0.65 | 0.35 |
| "LiNbO$_3$" + LiNb$_3$O$_8$ | 0.40 | 0.60 |

II. b. 8/65/35 PLZT

| PHASE MIXTURE | PLZT MOLAR COMPOSITION | | | | MOLAR EXCESS | |
|---|---|---|---|---|---|---|
| | M°$_{PbO}$ | M°$_{LaO_{1.5}}$ | M°$_{ZrO_2}$ | M°$_{TiO_2}$ | M$_{PbO}$ | M$_{ZrO_2}$ |
| PLZT(I) + PbO$_{ex.}$ | .9025 | .08 | .65 | .35 | 0.5 | |
| PLZT(II) + PbO$_{ex.}$ | .8726 | .08 | .65 | .35 | — | 0.1 |

Preparation of Crystalline Members

Single Crystal LiNbO$_3$

Optically transparent, colorless, single domain crystals of LiNbO$_3$ were obtained commercially from Crystal Technology, Inc. They were synthesized by the Czochralski technique, were grown along the c-axis, and were of unknown stoichiometry. The as-grown ferroelectric boules were poled along their c-axis after growth. The crystals were supplied as optically polished discs (0.750 × 0.030 inch) formed with their c-axis either parallel to (x-cut) or perpendicular to (z-cut), the plane surfaces.

Ion microprobe analysis was performed to establish the predominate impurities. The polished surfaces were found to contain a significant excess of iron, apparently a residue from the polishing procedure. A cleaning sequence was adopted to minimize this surface contamination. The crystals were degreased by consecutive treatment in trichlorethylene, acetone, ethyl alcohol, and distilled water, followed by consecutive baths in dichromic acid and circulating distilled water. The crystals were then washed in dilute HCl, re-rinsed in circulating distilled water, and air dried in a dust-free laminar flow hood.

Prior to cleaning, a small hole was drilled (0.020 inch) through the plane surfaces of each crystal, near the rim, to enable suspension by a thin Pt wire.

Polycrystalline 8/65/35 PLZT

Optically transparent, fully dense 8/65/35 PLZT was prepared by gravimetric liquid phase sintering and by "hot-pressing" (as obtained commercially from Honeywell Inc.). The sintered samples were formed as discs (0.350 inch diameter) and optically polished. The commercial "hot pressed" samples were formed as discs (0.750 × 0.030 inch) and optically polished. The discs were drilled and cleaned in the same manner used to drill and clean the LiNbO$_3$ discs.

Gravimetric Procedure

Thermogravimetric apparatus is used in conjunction with the slotted CAMP crucibles. The single-phase crystalline members were suspended from a Cahn R-100 Recording Electrobalance by means of a Pt wire such that they could be centered within the slotted crucible cavity. An outer platinum muffel crucible was utilized to prolong the life of the PLZT crucibles.

Proper alignment of the single crystal LiNbO$_3$ samples within crucible cavities was complicated by a strong surface charge that caused their attraction to the cavity walls. This surface charge was neutralized, at room temperature, by pre-treating the sample and the crucible in GC-Spectrophotometric quality isopropyl alcohol, and air-drying in a dust free laminar flow hood. Although initial heating caused vaporization of the alcohol, instant return of the surface charge, and re-attraction to the cavity walls, heating above 600° C, neutralized the surface charge once again. Thermally neutralized, sample alignment was restored and accurate ($\pm 5$-10 $\mu$g) continuous weighing possible. Background noise at 1100° C in air was primarily convection limited.

Phase Equilibria and Nonstoichiometry Data

Commercially supplied discs of single crystal LiNbO$_3$ or polycrystalline PLZT were broken into smaller pieces 300-500mg, drilled, cleaned, suspended within their high or low CAMP crucible (Table II), and heated (10° C/min to 850° C then at 20° C/min to the experimental temperature). The temperature was held until sample mass-change could not be detected. The total mass-change of the sample was recorded, and the temperature lowered rapidly to 600° C (20° C/min) and then furnace cooled. This procedure was repeated in alternating CAMP crucibles. Complete equilibration times varied from 5-100 hours depending upon sample weight and temperature.

The total reaction mass-changes, M ($\infty$), for a variety of LiNbO$_3$ single crystals are summarized in Table III for alternate equilibrations in high and low CAMP crucibles at 1050° C, 1100° C, 1115° C and 1140° C in air. The initial and phase boundary crystal compositions, $x_i$ and $x_b$, respectively, are calculated in terms of lithium oxide content.

Figure 4:
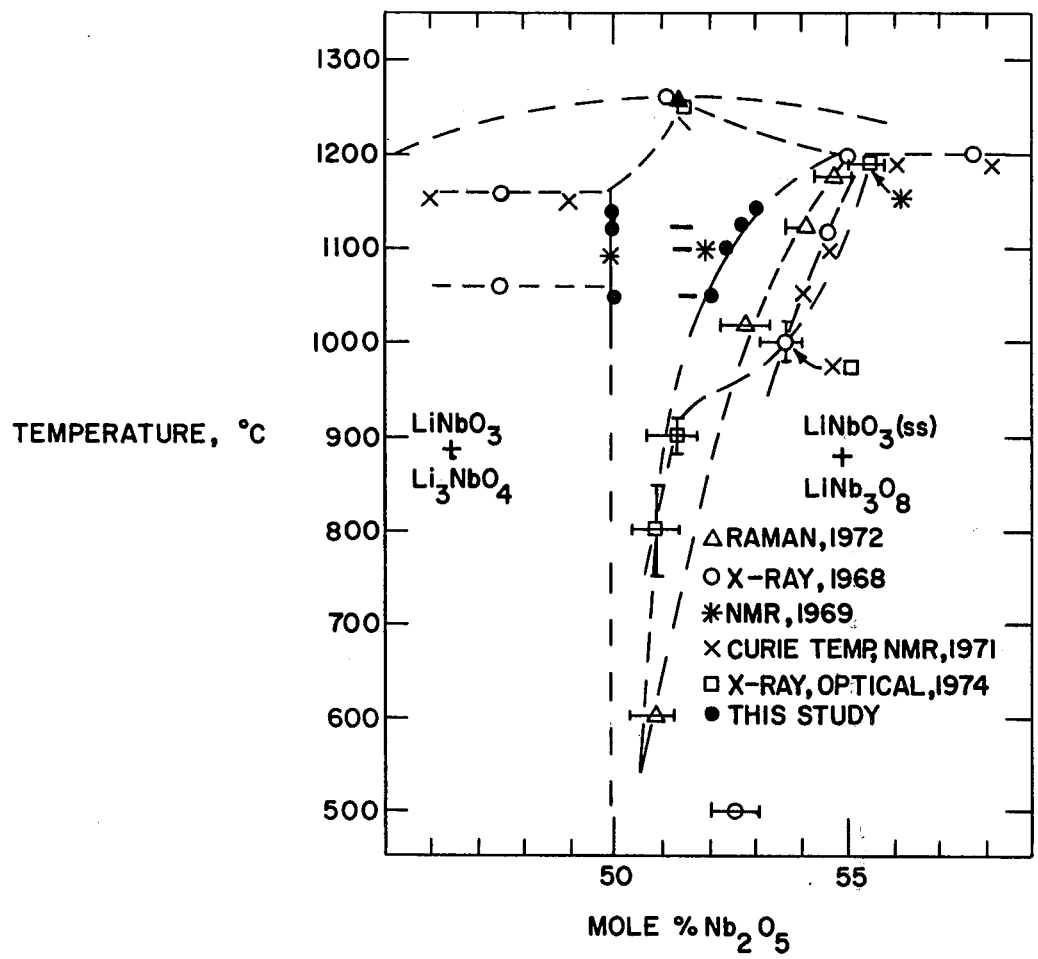
FIG. 4 is a graphical illustration of the data obtained in Table III.

The phase boundary compositions $x_b$ in Table III represent the maximum equilibrium deviations from stoichiometry, and are temperature dependent, decreasing in lithium oxide content as temperature increases. These results are plotted in FIG. 4, and are compared with reported Li$_2$O-Nb$_2$O$_5$ phase equilibria in the region of LiNbO$_3$. The initial crystal composition or nonstoichiometry, $x_i$, is referred to the stoichiometric composition, LiNbO$_3$, and as such is independent of temperature.

TABLE III

COMPLETE VAPOR PHASE EQUILIBRATION OF SINGLE CRYSTAL LiNbO$_3$
CAMP Crucible I : Li$_3$NbO$_4$ + LiNbO$_3$
CAMP Crucible II: LiNb$_3$O$_8$ + LiNbO$_3$ $Li_{1-2x}\square_x NbO_{3-x}\phi_x$
$(0 \leq x \leq x_b)$
$\nu$ = Mole Fraction Li$_2$O = $(0.5-x)/(1.0-x)$

| SAMPLE | | MASS-CHANGE M($\infty$) mgs | | | | INITIAL | | BOUNDARY | | TEMPERATURE |
|---|---|---|---|---|---|---|---|---|---|---|
| No. | Weight(gm) | I | II | I | II | $x_i$(mol) | $\nu_i$(%) | $x_b$(mol) | $\nu_b$(%) | ° C |
| PE1 | 0.3763$^{12}$ | 2.6$^{04}$ | 2.9$^{89}$ | 2.9$^{77}$ | — | 0.0340$^0$ | 48.24$^0$ | 0.0389$^6$a | 47.97$^3$ | 1050 |
| PE2 | 0.2978$^{34}$ | — | 1.7$^{91}$ | 2.3$^{56}$ | 2.3$^{17}$ | 0.0297$^0$ | 48.46$^9$ | 0.0389$^0$b | 47.97$^6$ | |
| PE10 | 0.5269$^{11}$ | 3.4$^{10}$ | 5.0$^{50}$ | 4.9$^{97}$ | — | 0.0318$^2$ | 48.35$^7$ | 0.0468$^8$c | 47.54$^1$ | |
| PE11 | 0.9967$^{73}$ | 5.7$^{21}$ | 9.4$^{79}$ | 9.5$^{69}$ | — | 0.0282$^4$ | 48.54$^7$ | 0.0470$^1$d | 47.53$^4$ | 1100 |
| V12 | 0.9998$^{38}$ | 5.4$^{79}$ | 9.3$^{31}$ | 9.6$^{29}$ | — | 0.0269$^3$ | 48.61$^6$ | 0.0466$^6$e | 47.55$^3$ | |
| V15 | 1.0126$^{13}$ | 6.0$^{14}$ | — | — | — | 0.0292$^2$ | 48.49$^5$ | — | — | |
| PE8.1 | 0.3553$^{23}$ | 1.7$^{94}$ | 3.7$^{46}$ | 3.7$^{26}$ | — | 0.0248$^6$ | 48.72$^5$ | 0.0517$^7$f | 47.27$^0$ | |
| PE8.2 | 0.3045$^{11}$ | 1.5$^{46}$ | 3.2$^{12}$ | 3.2$^{38}$ | — | 0.0249$^9$ | 48.71$^8$ | 0.0521$^3$g | 47.25$^0$ | 1125 |
| PE8.3 | 0.3402$^{46}$ | 1.7$^{14}$ | 3.5$^{85}$ | 3.5$^{53}$ | — | 0.0248$^0$ | 48.72$^8$ | 0.0516$^5$h | 47.27$^7$ | |
| PE9 | 0.4142$^{19}$ | 2.7$^{76}$ | 4.3$^{68}$ | 4.3$^{82}$ | — | 0.0329$^4$ | 48.29$^7$ | 0.0519$^2$i | 47.26$^2$ | |
| PE14 | 0.4756$^{81}$ | 3.5$^{99}$ | 5.7$^{13}$ | 5.6$^{94}$ | — | 0.0371$^6$ | 48.07$^0$ | 0.0588$^4$j | 46.87$^4$ | 1140 |

NOTES: Standard Deviation
a $\pm$ 0.00011
b $\pm$ 0.00002
c $\pm$ 0.00035
d $\pm$ 0.00031
e $\pm$ 0.00103
f $\pm$ 0.00019
g $\pm$ 0.00028
h $\pm$ 0.00032
i $\pm$ 0.00012
j $\pm$ 0.00020

Vapor phase equilibration, in addition to its analytical usefulness can be a practical means by which to standardize and homogenize as-grown lithium niobate single crystals, eliminating the annoying compositional variances, that occur from sample-to-sample, batch-to-batch, and no doubt, from supplier-to-supplier. One or more slices of differing composition and homogeneity can be equilibrated simultaneously within a multi-slotted CAMP crucible, FIG. 3, whose composition determines the final homogenized crystal composition. For example, as grown nonstoichiometric crystals, Table III, can be made stoichiometric by equilibration in CAMP crucible I (LiNbO$_3$ + Li$_3$NbO$_4$), or maximally nonstoichiometric by equilibration in CAMP crucible II (LiNbO$_3$ + LiNb3$_{O8}$). Homogenization of any intermediate nonstoichiometry is possible as well, as previously indicated.

The phase equilibria, nonstoichiometry, and defect structure of 8/65/35 PLZT has been characterized in detail by Knudsen effusion and serves as a suitable standard for comparison. The total reaction mass-changes, M ($\infty$), for two commercially supplied samples are summarized in Table IV for alternate equilibrations in high and low CAMP crucibles at 1100° C. The mean phase boundary composition, 0.0309$^1$ moles PbO, is in good agreement with the earlier result, 0.0299 moles PbO. The discrepancy , 3.4% is most likely due to a slight temperature error between the two different experiments.

TABLE IV.

COMPLETE VAPOR PHASE EQUILIBRIUM
OF HOT-PRESSED POLYCRYSTALLINE 8/65/35 PLZT
CAMP Crucible I : PbO + 8/65/35 PLZT
CAMP Crucible II: 8/65/35 PLZT + ZrO$_2$

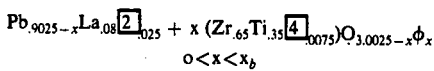

$$Pb_{.9025-x}La_{.08}\boxed{2}_{.025} + x(Zr_{.65}Ti_{.35}\boxed{4}_{.0075})O_{3.0025-x}\phi_x$$

$$o < x < x_b$$

| Sample | | Mass-Change, M(∞) mgs | | | Initial $x_i$ (moles) | Boundary $x_b$ (moles) | Temperature °C |
|---|---|---|---|---|---|---|---|
| No. | Weight | I | II | I | | | |
| W6 | .5388$^{71}$ | 6.6$^{64}$ | 11.5$^{61}$ | 11.7$^{43}$ | .0176$^{52}$ | .0308$^{6}$a | |
| W7 | .4291$^{82}$ | 6.4$^{44}$ | 9.3$^{94}$ | 9.2$^{73}$ | .0213$^{75}$ | .0309$^{7}$b | 1100° C |
| Mass-Loss Knudsen Effusion Result$^{24}$ | | | | | | .029$^{9}$c | |

NOTES: Standard Deviation
a ± .00033
b ± .00028
c ± .00026

The initial PLZT composition is found to vary significantly from sample-to-sample, indicating the inhomogeneity of the "hot-pressing" process. Vapor phase equilibration can be applied, as discussed for lithium niobate, to standardize and homogenize these sintered samples. Lead oxide-rich 8/65/35 PLZT (minimum nonstoichiometry) can be formed by equilibration in a high CAMP crucible (PbO + 9/65/35 PLZT). Lead oxide deficient 8/65/35 PLZT, (maximum nonstoichiometry) can be formed by equilibration in low CAMP crucible (8/65/35 PLZT + ZrO$_2$).

The phrase "mass transport between crystalline solid and solid crucible under vapor phase equilibrium conditions" as used herein, refers to the diffusion kinetics occurring in the process of the present invention and is used herein to mean that the following boundary conditions are satisfied: (1) the flux of molecules of the common vapor phase captured by one of the solids from the atmosphere of constant chemical potential is equal to the flux of molecules escaping from that same solid into the atmosphere of constant chemical potential, when that solid is equilibrated with the atmosphere of constant chemical potential; (2) when that solid is not equilibrated with the atmosphere and the solid causes either a greater number (in-diffusion) or lesser number (out-diffusion) of molecules of the common vapor phase to be captured than released, developing a driving potential for the diffusion of the common vapor phase (which dissociates) within the solid and either into or out of the solid, as appropriate; and (3) as either in-diffusion or out-diffusion proceeds, the mass gained or lost by the solid is a function of the net flux (with respect to the solid) of molecules of the common vapor phase and the surface area of the solid.

What is claimed is:

1. A crucible and crystalline slab member for vapor phase diffusion under equilibrium conditions between the crucible and the crystalline slab member, comprising: a porous, multi-phase solid crucible provided with at least one non-cylindrical cavity in which said crystalline slab member can be placed, said non-cylindrical cavity having dimensions about 1 to about 3 millimeters greater than said crystalline slab member, the said crucible and slab member comprising material which gives off the same chemical metal component in the vapor phase as said crystalline member at some temperature and whose common vapor phase is one having a pressure less than about 10$^{-4}$ atmosphere.

2. The crucible of claim 1 wherein said porous, multi-phase solid comprises LiNbO$_3$ and Li$_3$NbO$_4$.

3. The crucible of claim 1 wherein said porous, multi-phase solid comprises LiNbO$_3$ and LiNb$_3$O$_8$.

4. The crucible of claim 1 wherein said porous, multi-phase solid comprises 9/65/35 PLZT and lead oxide.

5. The crucible of claim 1 wherein said porous, multi-phase solid comprises 8/65/35 PLZT and zirconium dioxide.

6. The crucible of claim 1 wherein said solid is provided with a plurality of such cavities.

7. The crucible of claim 1 wherein said porous multi-phase solid comprises an equilibrium mixture of
compounds producing vapor species in common with the crystalline member, and whose non-volatile constituents are not in common with the non-volatile constituents of the crystalline member.

8. The crucible of claim 1 wherein said porous multi-phase solid comprises an equilibrium mixture of
compounds producing vapor species in common with the crystalline member, and whose non-volatile constituents include those both in common and not in common with the non-volatile constituents of the crystalline member.

* * * * *